United States Patent [19]
Debroux

[11] Patent Number: 5,914,639
[45] Date of Patent: Jun. 22, 1999

[54] AMPLIFIER WITH COMMON BASE INPUT STAGE

[75] Inventor: Jean-François Debroux, St. Etienne de St Geoirs, France

[73] Assignee: Thomson-CSF, Paris, France

[21] Appl. No.: 09/054,457

[22] Filed: Apr. 3, 1998

[30] Foreign Application Priority Data

Apr. 4, 1997 [FR] France .................................. 97 04155

[51] Int. Cl.[6] ....................................................... H03F 3/04
[52] U.S. Cl. ........................... 330/288; 330/293; 330/311
[58] Field of Search .................................. 330/293, 288, 330/311, 110; 323/315, 316

[56] References Cited

U.S. PATENT DOCUMENTS

| | | | |
|---|---|---|---|
| 4,374,363 | 2/1983 | Previti | 330/263 |
| 4,511,857 | 4/1985 | Gunderson | 330/311 |
| 4,677,392 | 6/1987 | Yang | 330/264 |
| 5,034,701 | 7/1991 | Debroux | 330/254 |
| 5,180,989 | 1/1993 | Sakurai et al. | 330/295 |
| 5,278,518 | 1/1994 | Debroux | 330/279 |
| 5,285,143 | 2/1994 | Bahr et al. | 318/805 |
| 5,376,900 | 12/1994 | Debroux | 330/271 |
| 5,506,525 | 4/1996 | Debroux | 327/91 |
| 5,530,404 | 6/1996 | Debroux | 330/278 |

FOREIGN PATENT DOCUMENTS 0 765 028  3/1997  European Pat. Off. .
1 383 598  2/1975  United Kingdom .

OTHER PUBLICATIONS

David J. White, 1990 IEEE Nuclear Science Symposium Conference Record, vol. 1 of 2, pp. 580 to 583, "Analogue Front End Electronics for the Zeus Central Tracking Detector", Oct. 22, 1990.

*Primary Examiner*—Robert Pascal
*Assistant Examiner*—Henry Choe
*Attorney, Agent, or Firm*—Oblon, Spivak, McClelland, Maier & Neustadt, P.C.

[57] ABSTRACT

A stage for the amplification of high frequency signals (HF) or intermediate frequency (IF) signals comprises a referenced non-differential input. The input of the amplifier is made on the emitter of an input transistor mounted in a common-base connection, converting the input voltage variations into current variations with a non-linear transfer curve that is, in principle, exponential or quadratic, these current variations being themselves copied, with a change in sign, into a second transistor and then converted by a third transistor into voltage variations with a non-linear transfer curve that is reciprocal to the previous one, this curve being in principle a logarithmic or square-root curve, and the voltage at the terminals of the third transistor being used as a feedback applied to the base of the first transistor. Application to the making of HF or IF input amplifier stages having a low noise factor and a wide dynamic range.

11 Claims, 4 Drawing Sheets

AMPLIFIER WITH COMMON BASE INPUT STAGE

BACKGROUND OF THE INVENTION

The invention relates to a stage for the amplification of high frequency signals (HF) or intermediate frequency (IF) signals.

The making of amplification systems working with HF or IF signals generally uses amplifiers whose input impedance is fairly low and well defined for it is necessary to match the input impedance of the amplifier with the output impedance of a generator connected to the input of this amplifier.

Furthermore, for the input stages of the amplifier (also called head stages) a low noise factor and a high compression point are sought to obtain the best amplifier performance characteristics. Indeed, the dynamic range of the signal applied to the input stage of the amplifier is limited, for the weak input signals, by the inherent noise of the stage and, for the strong input signals, by the non-linearities of the stage.

In bipolar technology, the structure most suited to this type of application is a common base input stage. In this structure, the input stage has a transistor mounted in a common-base connection. The input signal is applied to the emitter of the transistor, the base being biased by a fixed potential and the transmitter being biased by a constant current. The output signal is taken in the form of voltage at the collector of the transistor by means of a load resistor.

The common base input stage naturally has a low input impedance, a low noise factor and a wide passband. The weakness of this type of stage lies in its poor linearity. Despite this drawback, it is the common base assembly that has the best useful dynamic range.

It is known that the input impedance Zin, of the common base stage, in the form of small signals is:

$$Zin = \frac{kT}{q} \cdot \frac{1}{I_{co}}$$

Where k is the Boltzmann constant (1.38 E-23 SI), q is the charge of the electron (1.6 E-19 SI), T is the absolute temperature of the transistor and $I_{CO}$ is the current of the collector at rest.

The gain in voltage Av in terms of small signals is:

$$Av = \frac{V_{SI}}{V_{EI}} = \frac{R_c \cdot I_{co}}{\frac{kT}{q}}$$

$V_{E1}$ being the input voltage of the stage, $V_{S1}$ being the output voltage of the stage, and $R_c$ being the value of the load resistor connected between the collector of the transistor and a supply voltage VCC.

The expression of the output voltage as a function of the input voltage in terms of big signals is:

$$V_{SI} = V_{CC} - R_c \cdot \left( I_{co} \cdot \exp\left(-\frac{Vin}{\frac{kT}{q}}\right) \right)$$

$V_{in}$ being the input voltage in terms of big signals.

The output voltage varies exponentially with the input voltage. This clearly shows the poor linearity of this stage. The "linear" zone at input is equal to some kT/q, namely some tens of millivolts at most. Furthermore, the non-linear transfer characteristic generates harmonics and intermodulation at output.

Two known approaches are used to improve the linearity of the common base stage.

The first approach, known as <<degeneration>>consists of the addition of a resistor (degeneration resistor) series-connected between the input of the amplifier stage and the emitter of the transistor mounted in a common-base connection.

The input impedance is increased by the value of this resistor, leading to an increase in the idle current of the transistor, given that the input impedance of the transistor varies as the reverse of the idle current.

The linear zone at input of a stage of this kind is equal to about the range of the product of the current multiplied by the degeneration resistance plus some kT/q. It is therefore greater than that of the non-degenerate stage.

The tradeoff is that the noise factor is degraded. The increase in the permissible levels is lower than the degradation of the noise. The useful dynamic range is therefore degraded. This approach however is used when it is desired to increase the permissible levels and when the noise level is not of vital importance.

In the second approach, two transistors are mounted in differential form, each of the transistors being mounted in a common-base connection. In this configuration, the emitters of the transistors receive an input signal in differential form, the output of the stage being obtained in the same way in differential form at the collectors of the two transistors.

The making of the input stage in differential form enables the input impedance of the amplifier to be doubled. It is possible to double the idle current of each transistor if the same input impedance is to be preserved.

The linear zone at input is more than doubled as compared with the single stage comprising a single transistor, through the compensation for the curvature of the electrical parameters of one transistor by the other.

The noise factor is slightly degraded as compared with the stage being referred to. The increase in the permissible level is higher than the degradation of the noise. The useful dynamic range is therefore slightly improved. The transfer characteristic is an odd value, as a result of which the output spectrum contains few second harmonics and the intermodulation level is lower.

This stage in differential form, like the degenerate stage, is valuable for increasing the permissible level when the noise performance characteristics are not too important. The drawback of this stage is that it requires a signal in differential form, which is rarely the case in HF systems where the signal is often referenced with respect to the ground.

In the same way as in the case of a stage comprising a single transistor mounted in a common-base connection, the differential stage may be made degenerate by the serial connection of a resistor between each differential input of the stage and each emitter of the two transistors. This makes it possible to extend the range of the input linearity, but to the detriment of the noise factor. In this configuration, the permissible level of the input signal is increased but the useful dynamic range is thereby reduced.

SUMMARY OF THE INVENTION

In order to overcome the drawbacks of the prior art, the invention proposes an amplifier stage whose general structure is as follows: the input is non-differential but referenced with respect to a reference potential (the ground for example); the input is of a common base type, namely it is made on the emitter of an input transistor; this first transistor converts the input voltage variations into current variations with a non-linear transfer curve. This non-linear transfer curve is in principle exponential for the bipolar transistors and quadratic for the field-effect transistors. These current variations are themselves copied, with a change in sign, into an arm comprising a second transistor and a third transistor. Then the third transistor converts them into voltage variations with a non-linear transfer curve that is the reciprocal of the previous one, this curve being in principle a logarithmic or square-root transfer curve, and the voltage at the terminals of the third transistor is used as a feedback applied to the base of the first transistor.

The copying of the current (with or without the same amplitude) is preferably done by causing the first transistor to be crossed by an imposed current i and by setting up a supply voltage $[V_{be2}+V_{be3}+(R1+k.R2).i]$ at the terminals of a series-connected assembly comprising a resistor with a value R1 crossed by the current i, an emitter-base junction of a second transistor, a resistor with a value R2 and the third transistor mounted as a diode, $V_{be2}$ and $V_{be3}$ being the voltage drops at the terminals of the base-emitter junctions of the second and third transistors assumed to be crossed by a current k.i, k being a desired ratio of currents.

Indeed, the application of a supply voltage of this kind to this series-connected assembly dictates the passage of a current k.i into the second resistor, and any variation of the current i in the first resistor with a value R1 is transferred, with an opposite sign (with an equal or proportional amplitude), into the second resistor with a value R2.

BRIEF DESCRIPTION OF THE DRAWINGS

Other features and advantages of the invention as well as those of some of its variants shall appear from the following detailed description made with reference to the appended drawings, of which.

MORE DETAILED DESCRIPTION

Figure 1:
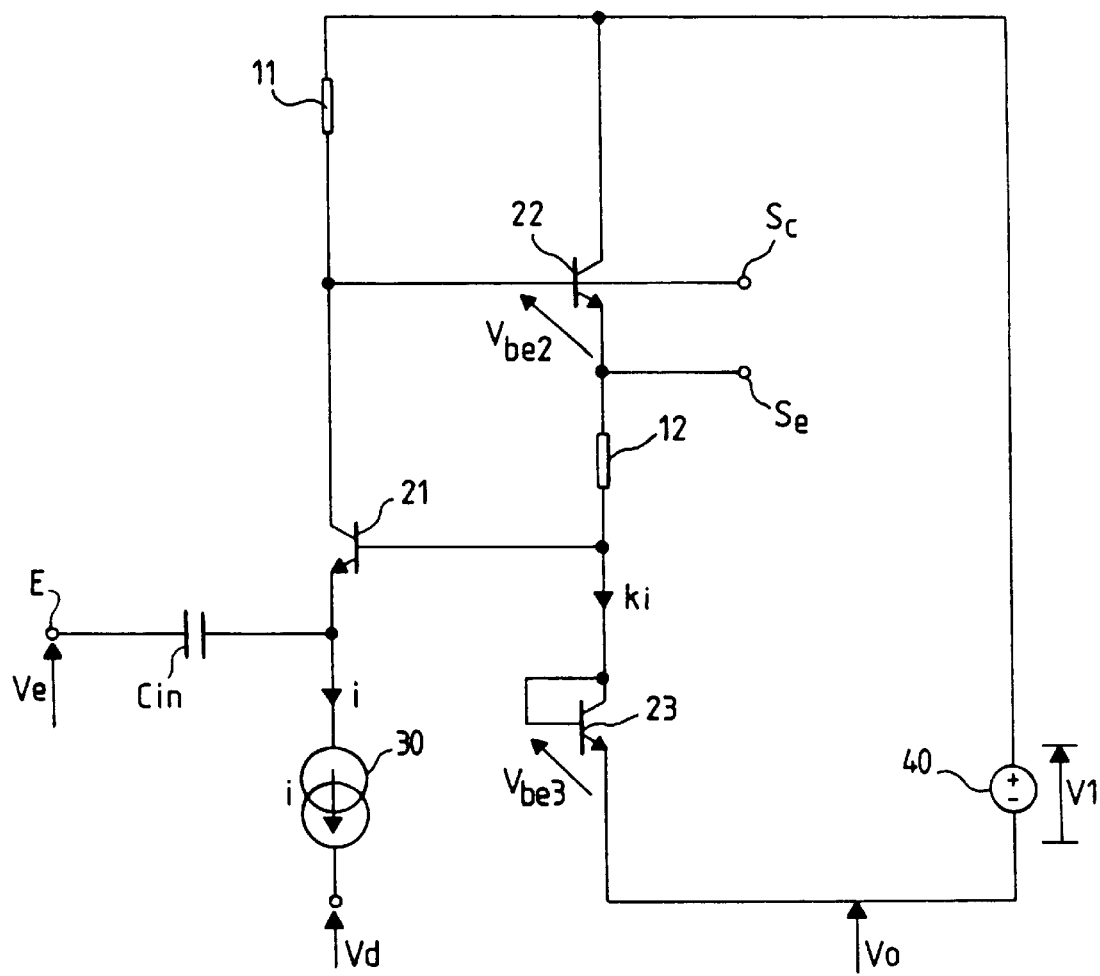
FIG. 1 gives a view of an amplifier stage according to the invention comprising a referenced output.

FIG. 1 shows an amplifier stage according to the invention comprising two arms. The first arm has at least one first resistor 11 having a value R1 series-connected with a first transistor 21 and a current source 30 having a value i. The second arm has at least one second transistor 22 series-connected with a second resistor 12 having a value R2 and with a third transistor 23, the emitter of this third transistor being connected to a reference potential Vo. The input E of the amplifier is connected to the emitter of the first transistor 21 (by a capacitor Cin for example). The amplifier stage also comprises means 40 for the application, to the two arms, of an identical potential V1 whose value, taken with respect to the reference potential Vo, is equal to $[V_{be2}+V_{be3}+(R1+k.R2).i]$. $V_{be2}$ and $V_{be3}$ are respectively the voltage drops between the base and the emitter of the second and third transistors when they are crossed by a current k.i, and k is any desired ratio between the current flowing through the second arm and the current flowing through the first arm. The base of the second transistor 22 is connected to the collector of the first transistor 21 and the base of the first transistor 21 is connected to the base and to the collector of the third transistor 23.

Should the second transistor 22 and the third transistor 23 be identical, the identical potential V1 applied to the two arms is equal to $[2 V_{be3}+(R1+k.R2).i]$.

If we consider moreover that the resistors 11 and 12 have the same value R1, the identical potential applied to the two arms is $[2 V_{be3}+(1+k)R1.i]$.

Should it be the case that there are second and third transistors that are identical and, at the same time, currents that are identical in both arms (k=1), the identical potential V1 applied is equal to $[2 V_{be3}+(R1+R2).i]$.

Let us consider the particular case where the resistors 11 and 12 have the same value R1 and k=1. The identical potential V1 applied to the two arms will be equal to $2[V_{be3}+R1.i]$.

In this particular case, the current in the first transistor 21 being i at rest, the sum of the collector currents of the first and third transistors (21 and 23) is constant. Indeed, at rest, the voltage at the collector of the first transistor 21 is equal to V1−R1.i.

The voltage at the emitter of the second transistor 22 is equal to $V1-R1.i-V_{be3}$. The voltage at the terminals of the second resistor 12 is equal to $V1-2V_{be3}-R1.i$ as V1 has a value equal to $2.(V_{be3}+R1.i)$. The voltage at the terminals of the second resistor 12 equals R1.i. Therefore, the current in the second resistor 12 and consequently in the third transistor 23 is i.

When there is a small input signal Ve at the input E of the amplifier, if the collector current of the first transistor 21 increases by a value Δi, the voltage at the collector of the first transistor 21 decreases by the value R1.Δi. Hence the voltage at the terminals of the second resistor 12 decreases by the same quantity. The current in the third transistor 23 therefore decreases by the value Δi. The sum of the collector currents of the first and third transistors 21 and 23 is therefore constant. The increase in the voltage at the input E, which is the cause of the increase Δi of the collector current i of the first transistor 21, is therefore expressed by a reduction in the base-emitter voltage $V_{be3}$ of the third transistor 23 by the same quantity.

The voltage at the base of the first and third transistors varies therefore as half of the input signal Ve, at a first approximation, should the transistors 21 and 23 be identical.

The increase in the current Δi therefore becomes: Δi=(gm1)/2.

The gain in voltage Av therefore becomes: Av=(gm1.R1)/2, gm1 being the transconductance of the first transistor 21.

The input impedance Zin of the amplifier is therefore Zin=2.(KT/q).(1/i).

When the input signal Ve is at a high level, the sum of the collector currents in the transistors 21 and 23 being constant, there are symmetrical limitations of signals when the current in the collector of one of the transistors 21 or 23 is equal to 2.i.

Between these two extremes, a complete computation shows that the output signal varies as a function of the input signal according to a relationship close to the hyperbolic tangential relationship of the differential amplifiers.

In the frequency domain, a complete computation shows compensation effects which ensure an operation of the negative feedback loop without any risk of oscillations.

The transfer characteristic is an odd value, thus ensuring a low level of even-order harmonics. This characteristic is linear on a fairly wide range which ensures a low level of intermodulation.

The signal at output of the amplifier may be taken either at a first output Se connected to a point of junction between the second resistor 12 and the emitter of the second transistor 22 or at a second output $S_c$ connected to a point of junction between the collector of the first transistor and an end of the first resistor 11.

If the output signal is taken at the emitter of the second transistor 22, the output impedance is far lower than if the signal is taken at the collector of the first transistor 21 and the charge has little effect on the passband.

The means 40 for applying an identical potential V1 to the two arms and the current source 30 imposing the current i can be obtained by different known means. In a monolithic circuit, it is possible to make profitable use of the proper matching of the components and the fact that all are at the same temperature to create the potential V1 by means of a servo-control system. The result is slightly more complex than in the case of a simple current source but concerns only DC voltages and currents and not the high frequency signal.

The following are the performance characteristics of the amplifier according to the invention:

Since the dimensions of the stage of FIG. 1 have been set so as to obtain an input impedance of 50 ohms and a gain of 25 dB, we obtain a noise factor of about 6 decibels and a value of the level of the input signal to obtain a compression point at 1 decibel comparable to that of the conventional stage with a common-base connection.

The third-order intermodulation level at output of the stage is 36 dB lower than it is for the standard stage. The input level to produce the same intermodulation level is 12 dB greater than it is for the conventional stage.

In all cases, and especially with large signals at input, the spectrum of the output signal of the new linearized stage has far fewer harmonics. The second harmonic level is 30 dB lower with the new stage and the level of the other harmonics, especially the third harmonic, is very low.

The new stage therefore shows a significant improvement in performance characteristics as compared with the prior art.

Figure 2:
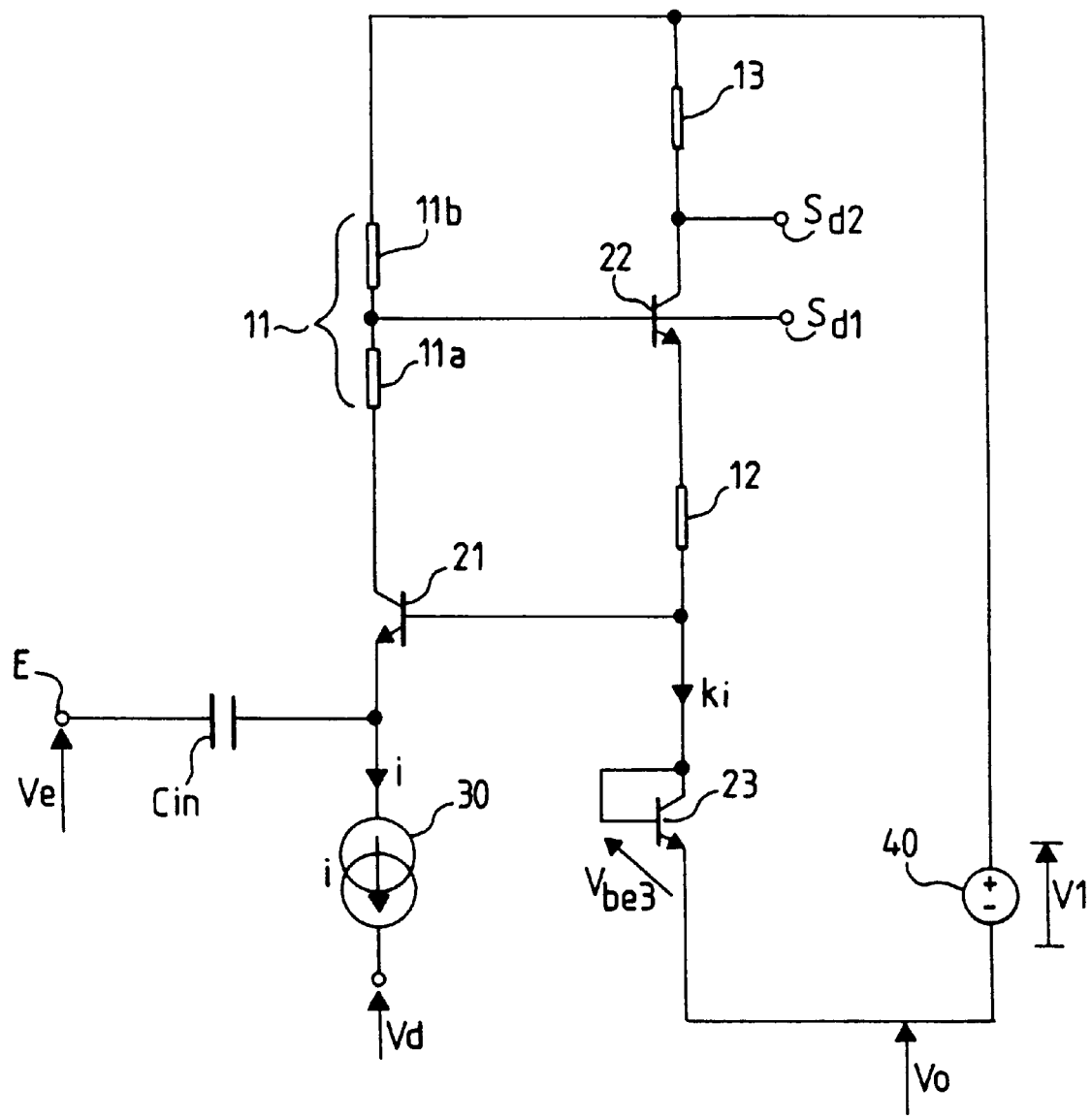
FIG. 2 shows a first variant of the amplification stage comprising a differential output.

FIG. 2 shows a first variant of the base stage of FIG. 1.

The collector currents of the first transistor 21 and of the second transistor 22 are in phase opposition. This particular feature can be profitably used to recover the signal in differential form. For this new configuration, the second arm has a third resistor 13 with a value n.R1, n being smaller than 1. One end of the third resistor is connected to the collector of the second transistor 22 while its other end receives the potential V1 equal to $[2V_{be3}+(R1+k.R2).i]$. The first resistor 11 with a value R1 is formed by the sum of a resistor 11a with a value (1−n).R1 connected to the collector of the first transistor 21, series-connected with a resistor 11b having a value n.R1. The amplifier has two differential outputs, one $S_{d1}$ connected to the junction point of these last two resistors and the other $S_{d2}$ connected to the collector of the second transistor 22.

Figure 3:
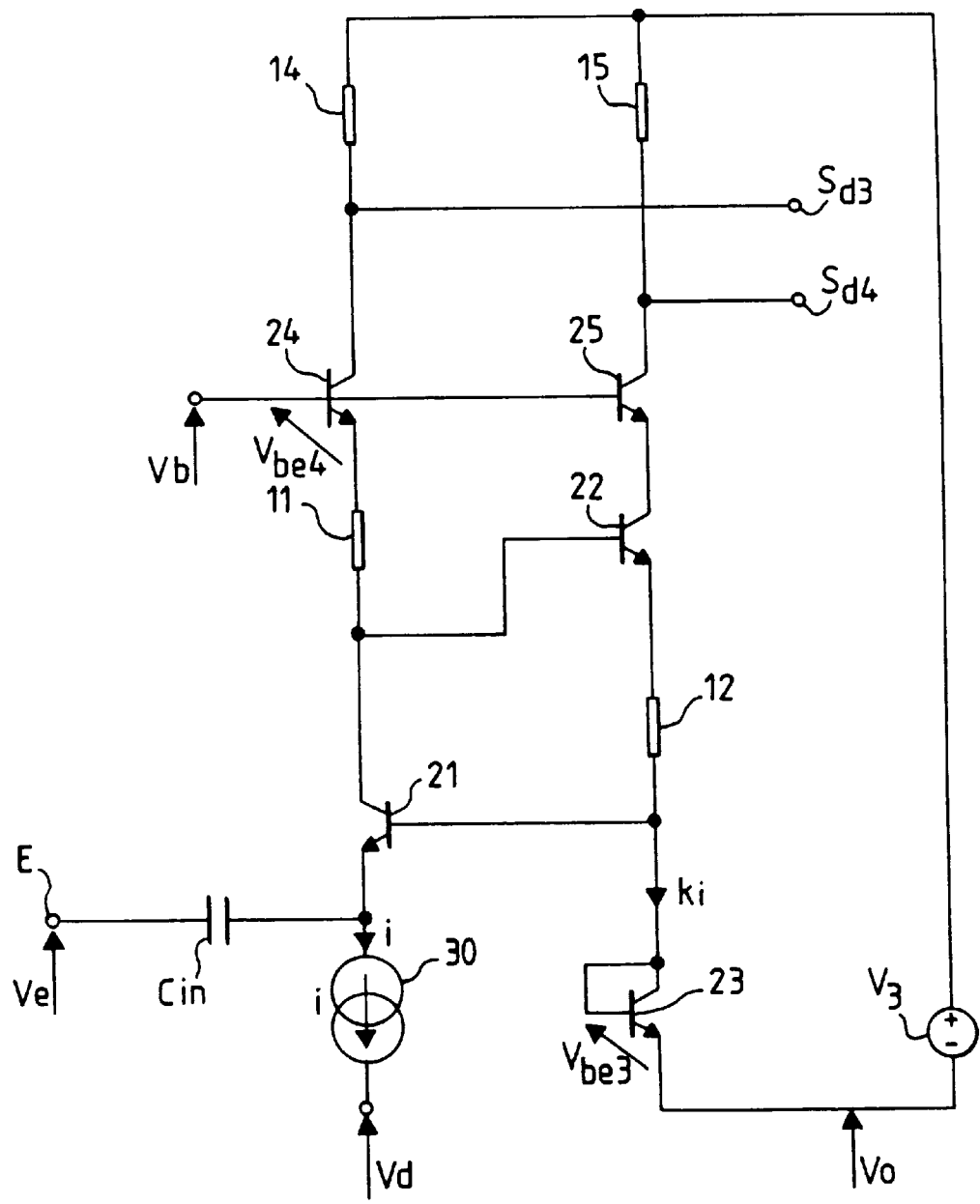
FIG. 3 shows a second variant of the cascoded amplification stage.

FIG. 3 shows the stage of FIG. 1 cascode-connected in order to reduce the input and output capacitances of the amplifier. In this variant, the potential $[2V_{be3}+(R1+k.R2).i]$ is applied to the two arms by the emitters of a fourth transistor 24 and a fifth transistor 25, the bases of which are connected to a base potential $V_b$ equal to $[V_{be4}+2V_{be2}+(R1+k.R2).i]$, $V_{be4}$ being the drop in base-emitter voltage of the fourth transistor 24 when it is crossed by the current i, the amplifier further comprising:

a fourth resistor 14 connected between the collector of the fourth transistor 24 and a voltage source V3, a fifth resistor 15 connected between the collector of the fifth transistor 25 and the voltage source V3, and two differential outputs $S_{d3}$ and $S_{d4}$ respectively connected to the collectors of the fourth and fifth transistors.

Figure 4:
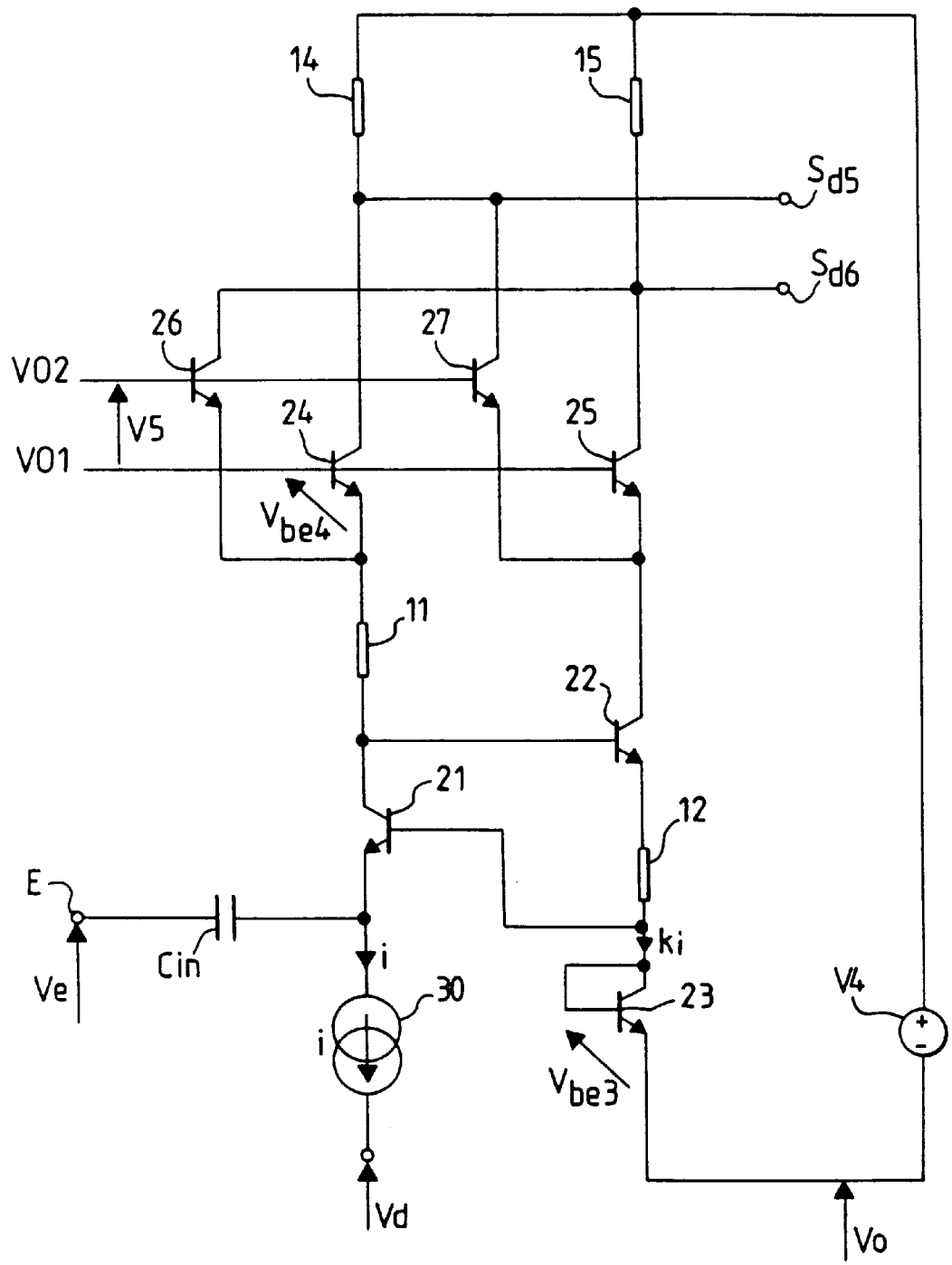
FIG. 4 shows a third variant of the amplification stage comprising a GILBERT mixer.

It is also possible to apply signals to a GILBERT mixer through the two current outputs of the two arms without using a current-voltage conversion. This provides for a significant reduction in noise. FIG. 4 shows a diagram comprising a GILBERT mixer input stage with low consumption. In this configuration, the potential $[2V_{be3}+(R1+k.R2).i]$ is applied to the two arms by the emitters of a fourth transistor 24 and a fifth transistor 25 whose bases are connected, the amplifier further comprising:

a fourth resistor 14 connected between the collector of the fourth transistor 24 and a voltage source V4, a fifth transistor 15 connected between the collector of the fifth transistor 25 and the voltage source V4, a sixth transistor 26 whose emitter is connected to the emitter of the fourth transistor 24 and whose collector is connected to the collector of the fifth transistor 25, a seventh transistor 27 whose emitter is connected to the emitter of the fifth transistor 25 and whose collector is connected to the collector of the fourth transistor 24, the bases of the sixth and seventh transistors being connected, differential outputs $S_{d5}$ and $S_{d6}$ respectively connected to the collectors of the fourth and fifth transistors, the base of the fourth transistor and the base of the sixth transistor receiving alternating differential voltages V01 and V02 having a fixed common mode potential V5 equal to $[V_{be4}+2V_{be3}+(R1+k.R2).i]$, $V_{be4}$ being the base-emitter voltage drop of the fourth transistor 24 when it is crossed by the current i.

In all the cases of the drawings described here above, the current source 30 placed at one end of the first arm will be connected to a potential $V_d$ smaller than the reference potential Vo applied to the other end of the first arm.

The transistors used in the drawings here above are NPN transistors. Identical diagrams can be used with PNP transistors by reversing the polarities of the supplies.

The drawings that have been described here above use bipolar transistors. These diagrams however can be transposed into MOS technology, and all the circuit transistors can be replaced by field-effect transistors. The base, emitter and collector of the transistors must then be interpreted as possibly signifying either the base, emitter and collector if the transistors are bipolar, or the gate, source and drain respectively if the transistors are field-effect transistors.

The operation is practically identical except for the fact that the voltage-current conversion, which is of an exponential type for a bipolar transistor, becomes a quadratic type conversion for a field-effect transistor.

What is claimed is:

1. An amplifier with non-differential input comprising two arms, the first arm having at least one first resistor with a value R1 series-connected with a first transistor and a current source with a value i, the second arm having at least one second transistor series-connected with a second resistor having a value R2 and with a third transistor, the emitter of this third transistor being connected to a reference potential Vo, the input E of the amplifier being connected to the emitter of the first transistor, means for the application, to the two arms, of an identical potential V1 whose value, taken with respect to the reference potential Vo, is equal to $[V_{be2}+V_{be3}+(R1+k.R2).i]$, $V_{be2}$ and $V_{be3}$ being respectively the voltage drops between the base and the emitter of the second and third transistors when they are crossed by a current k.i, and k being any desired ratio between the current flowing through the second arm and the current flowing through the first arm, the base of the second transistor being connected to the collector of the first transistor and the base of the first transistor being connected to the base and to the collector of the third transistor.

2. An amplifier according to claim 1, wherein the second and third transistors are identical and the identical potential V1 applied to the two arms is equal to $[2 V_{be3}+(R1+k.R2).i]$.

3. An amplifier according to claim 1, wherein the first resistor and the second resistor have the same value R1, and the identical potential applied to the two arms is $[2 V_{be3}+(1+k)R1.i]$.

4. An amplifier according to claim 1, wherein the ratio k is equal to 1, the currents in the two arms being identical, and the identical potential applied is $[2 V_{be3}+(R1+R2).i]$.

5. An amplifier according to one of the claims 1 to 4, wherein the current source, placed at one end of the first arm, is connected to a potential $V_d$ smaller than the reference potential Vo applied to the other end of the first arm.

6. An amplifier according to one of the claims 1 to 4, possessing a first output $S_e$ connected to a point of junction between the second resistor and the emitter of the second transistor, the potential $[2V_{be3}+(R1+k.R2).i]$ being applied to the collector of the second transistor.

7. An amplifier according to one of the claims 1 to 4, possessing a second output $S_c$ connected to a point of junction between the collector of the first transistor and an end of the first resistor, the potential $[2V_{be3}+(R1+k.R2).i]$ being applied to the other end of the resistor.

8. An amplifier according to one of the claims 1 to 4, wherein the second arm has a third resistor with a value n.R1, n being smaller than 1, one end of the third resistor being connected to the collector of the second transistor while its other end receives the potential V1 equal to $[2V_{be3}+(R1+k.R2).i]$, and the first resistor with a value R1 is formed by the sum of the resistance values of a resistor with a value (1−n).R1 connected to the collector of the first transistor, series-connected with a resistor having a value n.R1, the amplifier having two differential outputs, one $S_{d1}$ connected to the junction point of these last two resistors and the other $S_{d2}$ connected to the collector of the second transistor.

9. An amplifier according to one of the claims 1 to 4, wherein the potential $[2V_{be3}+(R1+k.R2).i]$ is applied to the two arms by the emitters of a fourth transistor and a fifth transistor, the bases of which are connected to a base potential $V_b$ equal to $[V_{be4}+2V_{be2}+(R1+k.R2).i]$, $V_{be4}$ being the drop in base-emitter voltage of the fourth transistor when it is crossed by the current i, the amplifier further comprising:

a fourth resistor connected between the collector of the fourth transistor and a source of voltage V3, a fifth resistor connected between the collector of the fifth transistor and the source of voltage V3, and two differential outputs $S_{d3}$ and $S_{d4}$ respectively connected to the collectors of the fourth and fifth transistors.

10. An amplifier according to one of the claims 1 to 4, wherein the potential $[2V_{be3}+(R1+k.R2).i]$ is applied to the two arms by the emitters of a fourth transistor and a fifth transistor whose bases are connected, the amplifier further comprising:

a fourth resistor connected between the collector of the fourth transistor and a source of voltage V4, a fifth transistor connected between the collector of the fifth transistor and the source of voltage V4, a sixth transistor whose emitter is connected to the emitter of the fourth transistor and whose collector is connected to the collector of the fifth transistor, a seventh transistor whose emitter is connected to the emitter of the fifth transistor and whose collector is connected to the collector of the fourth transistor, the bases of the sixth and seventh transistors being connected, differential outputs $S_{d5}$ and $S_{d6}$ respectively connected to the collectors of the fourth and fifth transistors, the base of the fourth transistor and the base of the sixth transistor receiving alternating differential voltages V01 and V02 having a fixed common mode potential V5 equal to $[V_{be4}+2V_{be3}+(R1+k.R2).i]$, $V_{be4}$ being the base-emitter voltage drop of the fourth transistor when it is crossed by the current i.

11. An amplifier comprising a non-differential input referenced with respect to a reference potential, the input being of a common base type, i.e. made on the emitter of an input transistor, this first transistor converting the input voltage variations into current variations with a non-linear transfer curve that is, in principle, exponential for the bipolar transistors and quadratic for the field-effect transistors, these current variations being themselves copied, with a change in sign, into an arm comprising a second transistor and a third transistor, then converted by the third transistor into voltage variations with a non-linear transfer curve that is reciprocal to the previous one, this curve being in principle a logarithmic or square-root curve, and the voltage at the terminals of the third transistor being used as a feedback applied to the base of the first transistor, the copying of the current being done by causing the first transistor to be crossed by an imposed current i and by setting up a supply voltage $[V_{be2}+V_{be3}+(R1+k.R2).i]$ at the terminals of a series-connected assembly comprising a resistor with a value R1 crossed by the current i, an emitter-base junction of a second transistor, a resistor with a value R2 and the third transistor mounted as a diode, $V_{be2}$ and $V_{be3}$ being the voltage drops at the terminals of the base-emitter junctions of the second and third transistors assumed to be crossed by a current k.i, k being a desired ratio of currents.

* * * * *